(12) United States Patent
Emoto

(10) Patent No.: US 6,982,782 B2
(45) Date of Patent: Jan. 3, 2006

(54) PROCESSING APPARATUS FOR PROCESSING OBJECT IN VESSEL

(75) Inventor: Keiji Emoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/797,843

(22) Filed: Mar. 9, 2004

(65) Prior Publication Data

US 2004/0179178 A1    Sep. 16, 2004

(30) Foreign Application Priority Data

Mar. 10, 2003    (JP) .............................. 2003-064199

(51) Int. Cl.
*G03B 27/42* (2006.01)
*G03B 27/52* (2006.01)

(52) U.S. Cl. .......................................... 355/53; 355/30
(58) Field of Classification Search .................. 355/30, 355/53

See application file for complete search history.

(56) References Cited

U.S. PATENT DOCUMENTS

| 6,630,984 B2 | 10/2003 | Bisschops |
| 6,700,641 B2 * | 3/2004 | Shiraishi ...................... 355/30 |
| 2001/0050759 A1 * | 12/2001 | Kamiya ....................... 355/30 |
| 2002/0027644 A1 | 3/2002 | Bisschops |
| 2003/0192686 A1 * | 10/2003 | Hisai et al. .................. 165/201 |
| 2004/0248315 A1 * | 12/2004 | Klein et al. .................. 436/147 |

FOREIGN PATENT DOCUMENTS

| JP | 10-154655 | 6/1998 |
| JP | 3567146 | 9/2004 |

* cited by examiner

*Primary Examiner*—Judy Nguyen
*Assistant Examiner*—Kevin Gutierrez
(74) *Attorney, Agent, or Firm*—Morgan & Finnegan, L.L.P.

(57) ABSTRACT

An apparatus for processing an object includes a vessel which forms a pressure-reduced inner space and accommodates the object, a member which is supported by an inner side of the vessel through a heat insulator, and a temperature adjusting portion which adjusts a temperature of the member.

1 Claim, 9 Drawing Sheets

US 6,982,782 B2

PROCESSING APPARATUS FOR PROCESSING OBJECT IN VESSEL

FIELD OF THE INVENTION

The present invention relates to a technique for processing an object in a vessel and, for example, to a technique for maintaining an object at a constant, uniform temperature in a vessel that forms a pressure-reduced atmosphere such as a vacuum atmosphere.

BACKGROUND OF THE INVENTION

In a conventional temperature-controlled vessel, a temperature-adjusted gas medium is circulated in the vessel to set an apparatus in the vessel at the same temperature as that of the gas medium, so that the vessel serves as a temperature-controlled vessel. A prior art for an exposure apparatus that utilizes a temperature-controlled vessel will be described (see, e.g., Japanese Patent Laid-Open No. 10-154655). FIG. 9 is a schematic sectional view showing a temperature-controlled vessel in an exposure apparatus EO. The exposure apparatus EO has an exposure unit 114 having an illumination optical system, projection lens system, reticle stage, wafer stage, and the like (neither is shown) in a chamber 101a formed of a housing 101, a reticle library 113 disposed near the exposure unit 114, a carrier table 111 for placing a wafer carrier 112 thereon, and the like.

In one side wall of the housing 101, a reticle inlet/outlet port 109 provided with an opening/closing door 109a is formed at a portion corresponding to the reticle library 113, and a wafer inlet/outlet port 110 provided with an opening/closing door 110a is formed at a portion corresponding to the carrier table 111.

A ceiling space 102 partitioned by a filter 102a, through which clean air blows out as a down flow, is formed in the upper portion in FIG. 9 of the chamber 101a. An under-floor space 104 partitioned by a floor 103 having a plurality of exhaust ports is formed in the lower portion in FIG. 9 of the chamber 101a. The ceiling space 102 and under-floor space 104 communicate with each other through a circulation duct 105 in which a temperature adjustment unit 106 is interposed. Air introduced by an air introduction fan 107 to the ceiling space 102 blows out as a down flow of clean air through the filter 102a. Air collected in the under-floor space 104 by an exhaust fan 108 is adjusted to a predetermined temperature by the temperature adjustment unit 106 of the circulation duct 105, is supplied to the ceiling space 102 by a circulation fan 109, and is circulated again.

The temperature-adjusted air is circulated in the chamber in this manner, so that the temperature of the exposure unit 114 sensitive to a temperature change is maintained at a constant value.

In the prior art example, the temperatures of the devices in the vessel are adjusted through the gas. In an apparatus with a vessel the interior of which is to be evacuated, the temperature in the apparatus cannot be adjusted through gas. In particular, in an exposure apparatus which exposes a target object such as a single-crystal substrate for a semiconductor wafer, a glass substrate for a liquid crystal display (LCD), and the like by utilizing EUV (extreme ultraviolet) light, the optical system must be maintained in a vacuum atmosphere in order to prevent the EUV light from attenuating by absorption by air.

When the gas as a heating medium does not exist, heat flow is limited to radiation and heat conduction through members that connect the devices and a vessel that accommodates the devices. Generally, when installing a precision device, the device is often fixed by 3-point support so that no looseness is produced or that the device will not be adversely affected by relative deformation between the device and vessel. For this reason, the contact area between the device and vessel is very small, and heat flow by conduction is small. Even if temperature adjustment by heat conduction is possible, only some device in the vessel can be temperature-adjusted, and it is difficult to maintain the whole devices at a uniform temperature.

From the foregoing, in a vessel such as a vacuum temperature-controlled vessel that forms a pressure-reduced atmosphere, radiation is significant as a means for maintaining devices or the like in the vessel at a constant value. Assume an arrangement in which, as shown in FIG. 8, the temperature of whole members that constitute a vessel 7 is adjusted to a constant, uniform value, so that a device in the vessel 7 is equilibrated with the temperature of the vessel members by radiation as heat flow. In FIG. 8, reference numeral 1 denotes a target to be temperature-adjusted (in this case, a substrate as an exposure target); 2, a top plate; 3, guides; 4, driving sections; 5, a stage surface plate; 6, refrigerant pipes; 7, a vacuum vessel; 8, an optical system device; 9, heat-insulating support members; 10, refrigerant pipes (for radiation shielding plates); and 12, an exhaust device.

When the temperature-controlled vessel is used as a vacuum vessel, the exhaust device 12 for maintaining the vacuum is connected to the vessel 7. If the exhaust device 12 is constituted by a turbo-molecular pump or the like, heat is generated in a large amount, and the exhaust device 12 is generally connected directly to the vessel 7. In an EB (Electron Beam) exposure apparatus or the like, a large amount of heat generated by an electron gun is known. Due to these influences of heat generation, a nonuniform temperature distribution tends to be formed in the vessel 7. Regarding the vacuum vessel, the thickness of the vessel 7 is generally large in order to increase the resistance against the pressure, and accordingly the heat capacity is large. It is relatively easy to keep the temperature constant in the vessel 7. It is, however, difficult to suppress temperature nonuniformity caused by the heat generation at high accuracy. Depending on the location where the vacuum vessel is installed, the vessel tends to be cooled insufficiently against a large temperature change of the atmosphere of the installation environment. Then, temperature nonuniformity may occur in the vessel and the interior of the vessel.

Generally, a precision device is sensitive to a temperature change. For example, in an exposure apparatus, a substrate as an exposure target and its periphery are allowed to have temperature changes during exposure of only as low as 0.1 m° C. to 1 m° C. Any temperature change exceeding this range may cause resolution nonuniformity. For this reason, demands have been arisen for a vessel that can maintain a device arranged in the vessel at a uniform, constant temperature regardless of the environment where the vessel is installed.

SUMMARY OF THE INVENTION

The present invention has been made based on the recognition of the above issues, and has as its object to prevent a temperature change in a vessel which occurs upon, e.g., exhaust or replacement of stored objects, more effectively in a pressure-reduced atmosphere such as a vacuum atmosphere formed in the vessel.

According to the present invention, there is provided a substrate processing apparatus comprising a substrate processing unit, a chamber which accommodates the substrate processing unit in a pressure-reduced ambient, and a temperature adjusting plate arranged between the substrate processing unit and the chamber.

According to the other aspect of the present invention, there is provided an exposure apparatus comprising an exposure processing unit which exposes a substrate with a pattern, a chamber which accommodates the exposure processing unit in a pressure-reduced ambient, and a temperature adjusting plate arranged between the exposure processing unit and the chamber.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1:
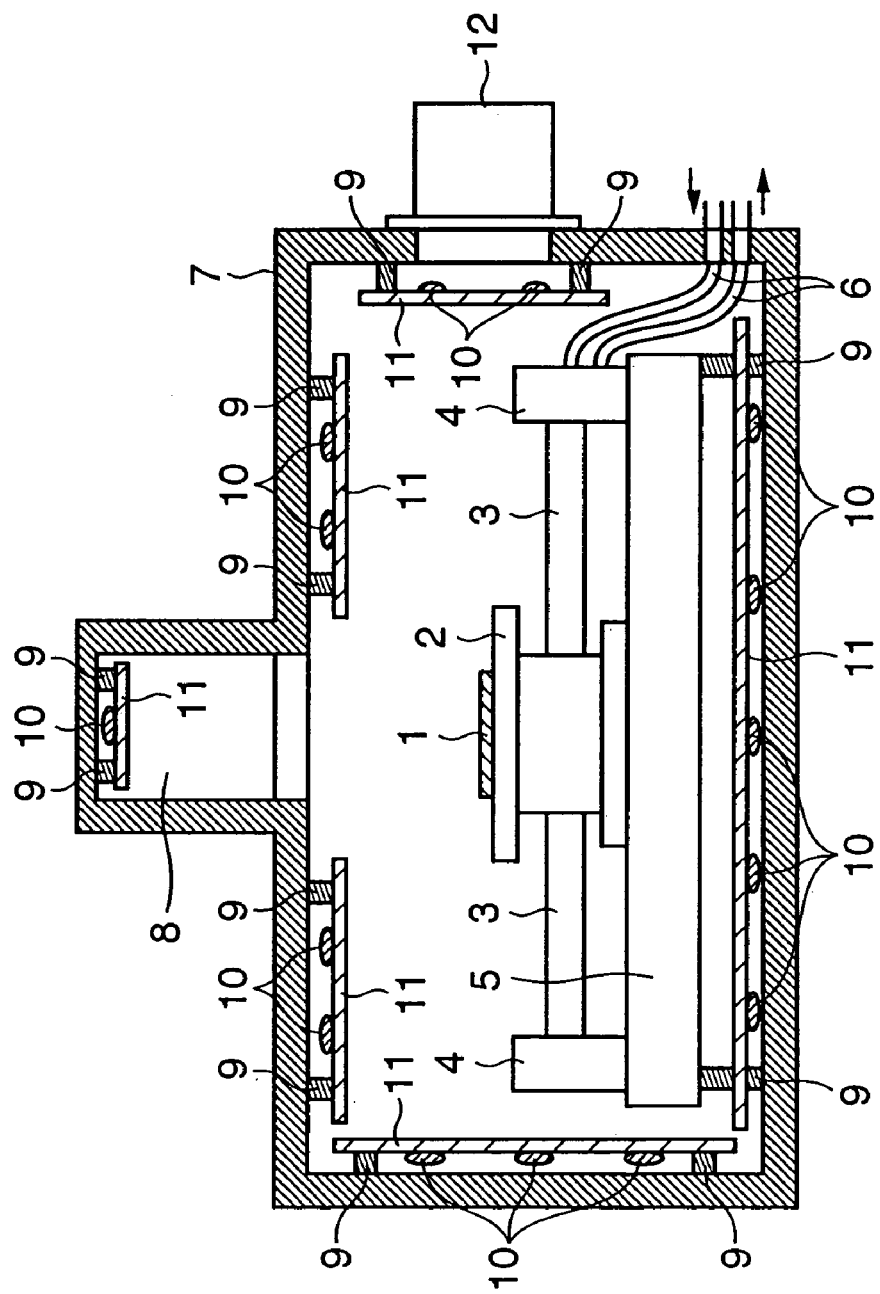
FIG. 1 is a schematic sectional view of a vessel according to the first embodiment of the present invention.

FIG. 1 shows the arrangement of an alignment apparatus according to a preferred embodiment of a processing apparatus of the present invention. In the embodiment shown in FIG. 1, at least part of the alignment apparatus is arranged in a vessel (chamber) formed as a temperature-controlled vacuum vessel. Temperature adjusting plates 11 are attached to the inner side of a vessel (chamber) 7 through heat-insulating support members 9, and refrigerant pipes 10 are arranged on the temperature adjusting plates 11. Other cooling pipes may also be arranged in contact with the inner and/or outer surface of the vessel 7.

The temperature adjusting plates 11 preferably have plate-like shapes, but can have various other shapes. The vessel 7 can have an upper portion, side portions, and a lower portion as partitioning portions that partition the inner space of the vessel 7 from the outer space. The temperature adjusting plates 11 can be arranged at appropriate inner portions of all or some of the upper, side, and lower portions through heat insulators. In general, a processing target is supported by a support structure or support mechanism arranged below it. Hence, the temperature adjusting plates 11 are preferably arranged at the appropriate inner portions of at least the upper or side portion, among the upper, side, and lower portions that form the partitioning portions, through heat insulators. The temperature adjusting plates 11 have surfaces exposed to the inner space of the vessel 7.

Figure 4:
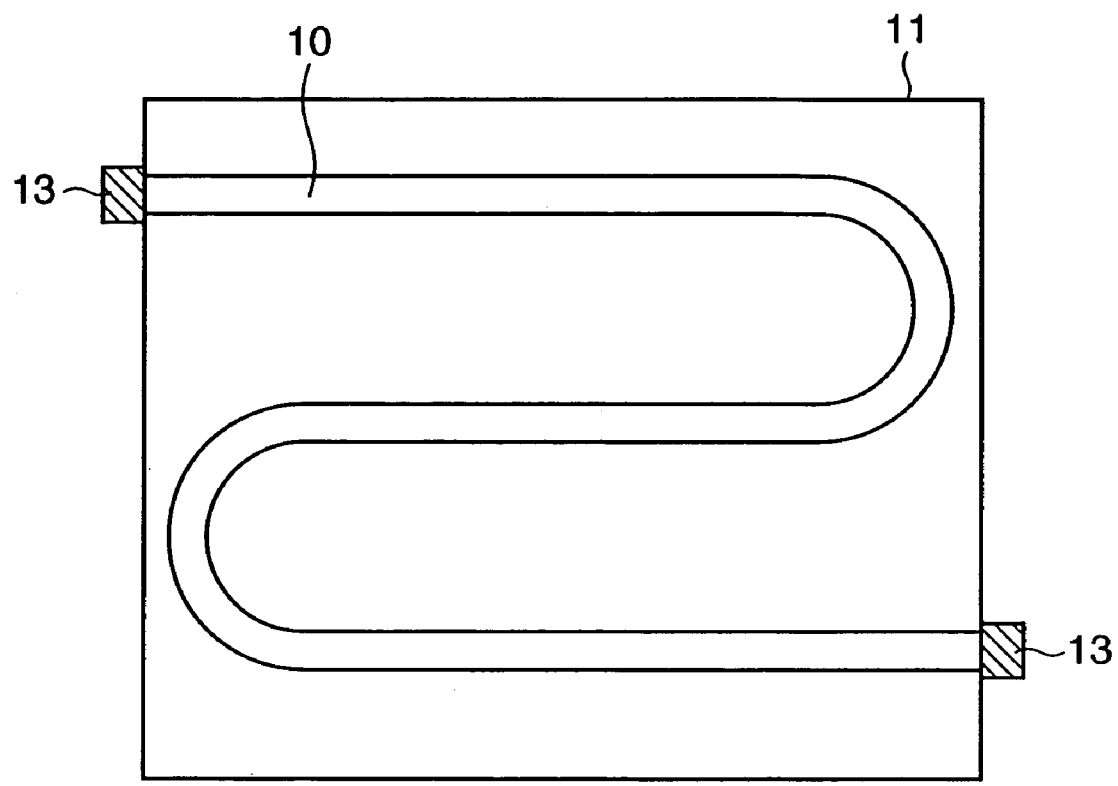
FIG. 4 is a schematic plan view of a temperature adjusting plate suitable for the vessel shown in FIG. 1.
Figure 5:
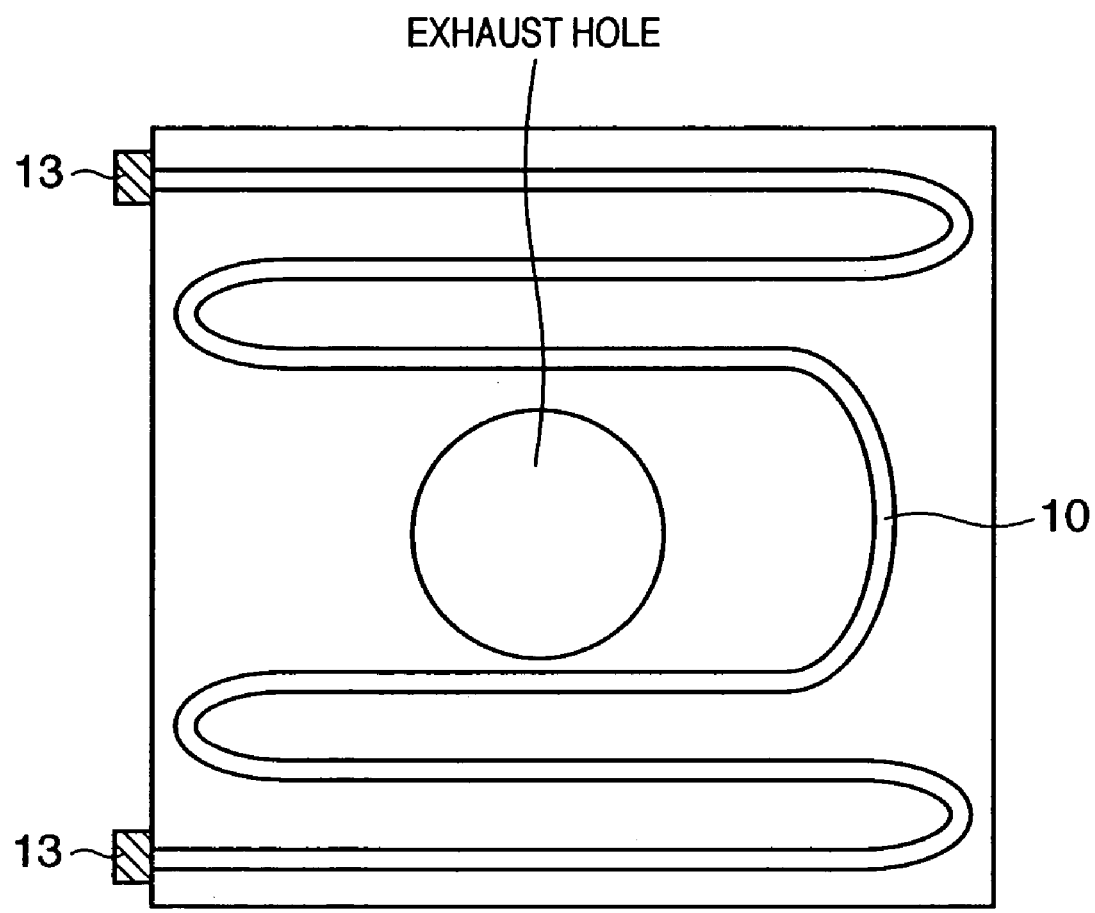
FIG. 5 is a schematic plan view of another temperature adjusting plate suitable for the vessel shown in FIG. 1.

The refrigerant pipes 10 are in tight contact with the temperature adjusting plates 11. When a refrigerant which is temperature-adjusted accurately flows through the refrigerant pipes 10, the temperature adjusting plates 11 are accurately adjusted to a uniform, constant temperature. As is exemplified in FIG. 4, the refrigerant pipe 10 preferably extends in the entire temperature adjusting plate 11 so that no temperature nonuniformity occurs in the temperature adjusting plate 11. Generally, the temperature of an exhaust device 12 such as a turbo-molecular pump increases high. In order to prevent heat radiation generated by the exhaust device 12 from entering the vessel 7, the temperature adjusting plate 11 as shown in FIG. 4 is arranged to oppose the exhaust port. This is preferable in shielding the heat flowing from the outer environment to the inner space of the vessel 7. If the temperature adjusting plate 11 closes the exhaust port, the exhaust efficiency of the exhaust device 12 degrades. In view of this, a temperature adjusting plate exemplified in FIG. 5 is also useful depending on the balance of the exhaust efficiency and heat specification. Although the arrangement shown in FIG. 5 has a disadvantage in that heat radiation from the exhaust device 12 leaks into the vessel 7 to a certain degree, the temperature adjusting plate has a hole at its portion opposing the exhaust port. The size of the hole should be determined in accordance with the balance of the exhaust efficiency and heat specification.

The temperature adjusting plates 11 can be set at, e.g., the same temperature as the preset temperature (e.g., 23° C.) of the entire alignment apparatus. In place of or in addition to the method described above, temperature adjustment of the temperature adjusting plates 11 may be performed by using a cooling element such as a Peltier element, so that the temperature adjusting accuracy can be further improved. The present invention can employ any temperature adjusting scheme as far as it can adjust the temperature of the temperature adjusting plates 11 with a desired accuracy.

In the temperature adjusting mechanism of this embodiment, a temperature sensor and heater device (not shown) are connected to each temperature adjusting plate 11, and a refrigerant (e.g., water, alcohol, a fluorine-based refrigerant, flon, or the like) is introduced to the temperature adjusting plate 11, so that the temperature of the temperature adjusting plate 11 is controlled to a predetermined value. The temperature adjusting plate 11 can be made of a material such as stainless steel which has high thermal conductivity and can easily form a flow channel through which the refrigerant flows.

With this arrangement, even if a large temperature change occurs in the vessel 7, fluctuation of the radiant heat caused by the temperature change is absorbed by the temperature adjusting plates 11 which are temperature-controlled. As a result, the influence of the temperature change of the vessel 7 on an alignment target 1 and the entire alignment apparatus can be decreased. In other words, heat disturbance from the vessel 7 to its interior can be shielded effectively.

When the temperature adjusting plates 11 are set at the same temperature as the temperature of the alignment target 1 and that of the entire alignment apparatus, the temperature of part or the entire portion of the alignment apparatus may become higher or lower than the preset temperature. In this case, due to heat flow generated by the radiant heat between the temperature-fluctuating portion and the temperature adjusting plates 11, the temperature of the temperature-fluctuating portion equilibrates in the direction to be close to the temperature of the temperature adjusting plates 11. As a whole, the entire portion of the alignment apparatus is temperature-adjusted to a uniform, constant value.

The refrigerant pipes 10 are disposed on the temperature adjusting plates 11 and not on the vessel 7, because this makes temperature adjustment easier. As the entire surface of the vessel 7 is in contact with the ambient atmosphere (gas), the heat flow area is large, and the temperature of the vessel 7 tends to be adversely affected by the atmospheric temperature very easily. Meanwhile, the temperature adjusting plates 11 are set in the vessel 7, and are supported by the vessel 7 through the heat insulators 9. Thus, substantially no heat flow occurs and temperature adjustment is easy.

In order to enhance these effects, the emissivity of the surface of the vessel 7 and the emissivities of the vessel-side surfaces of the temperature adjusting plates 11 are preferably decreased, so that heat flow between the vessel 7 and temperature adjusting plates 11 decreases. In order to promote heat flow between the temperature adjusting plates 11 and alignment apparatus, the emissivities of those surfaces of the alignment apparatus which oppose the temperature adjusting plates 11 and the emissivities of the alignment apparatus-side surfaces of the temperature adjusting plates 11 are preferably set high. If the apparatus in the vessel 7 has a heat-generating or heat-absorbing element, the apparatus may accordingly have a portion with a nonuniform temperature. In this case, the emissivity of the heat-generating or heat-absorbing portion and the emissivity around it are preferably decreased, so that the portion with the nonuniform temperature will not adversely affect the peripheral portion.

When the emissivity is to be set to, e.g., about 0.4 or less, the specified member may be formed of a surface-polished metal or the like. When the emissivity is to be set to, e.g., about 0.8 or more, the specified member may be formed of a resin, e.g., polyimide or PEEK, which releases less gas, glass, or a metal having a thick oxide film. Due to the issue of rigidity or the like, if the specified member cannot be entirely made from such material, the material may be formed on the surface of the member by adhesion or deposition.

More practically, the emissivities of those surfaces of the temperature adjusting plates 11 which oppose the vessel 7 or of those inner surfaces of the vessel 7 which oppose the temperature adjusting plates 11 are preferably adjusted to be about 0.4 or less. When the emissivities are set low, the temperature change of the vessel 7 can be prevented from adversely affecting the temperature adjusting plates 11 due to radiation between the temperature adjusting plates 11 and the inner surface of the vessel 7. The emissivities of those surfaces of the temperature adjusting plates 11 which oppose the target 1, or of those surfaces of the target 1 which oppose the temperature adjusting plates 11, are preferably adjusted to be 0.8 or more. Also, the emissivity of that surface of the temperature-controlled vessel 7 which is maintained at a constant temperature is preferably adjusted to be about 0.8 or more. When the emissivity is set high, radiation is promoted, so that the temperatures of the target and vessel can be maintained at a constant value.

Figure 2:
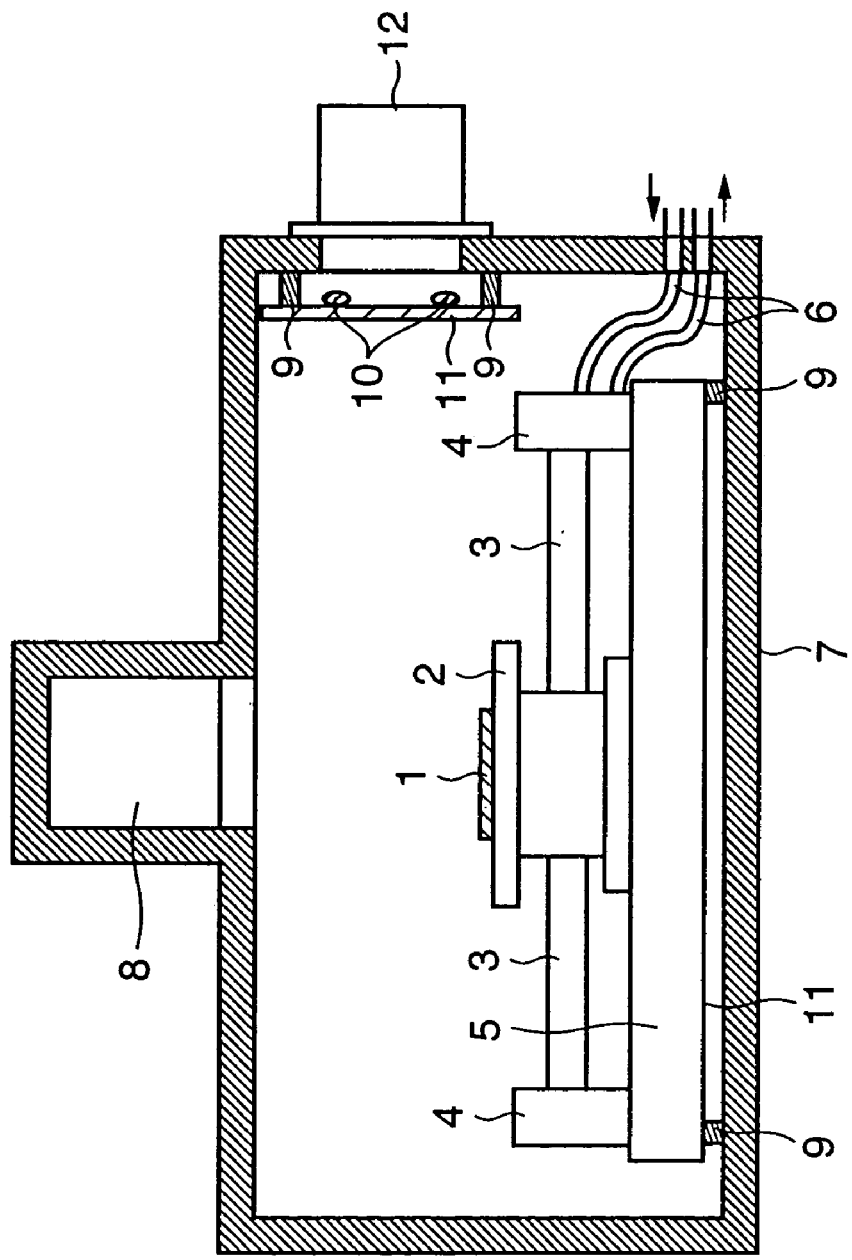
FIG. 2 is a schematic sectional view of a vessel according to the second embodiment of the present invention.

FIG. 2 shows a modification of FIG. 1. FIG. 2 shows an example in which the temperature adjusting plate 11 is set only at that portion in the vessel 7 where temperature nonuniformity can occur.

Regarding the vacuum vessel 7, usually, the exhaust device 12 such as a turbo-molecular pump is connected directly to the vessel 7. As heat generated by the exhaust device 12 causes temperature nonuniformity of the vessel 7, the temperatures of the devices in the vessel 7 are changed, so that the performance as the temperature-controlled vessel is degraded. To prevent this, the temperature adjusting plate 11 is arranged around that portion in the vessel 7 where no temperature nonuniformity is allowed. Regarding that portion of the inner wall of the vessel 7 where the temperature change falls within an allowable range, no temperature adjusting plate 11 need be set there. In this manner, when a heat-generating body such as the exhaust device 12 is provided to the vessel 7, a temperature adjusting plate is set only around that portion in the vessel where temperature is increased by the heat generated by the heat-generating body. Thus, the function as the temperature-controlled vessel can be achieved easily. At this time, that portion of the inner wall of the vessel where no temperature adjusting plate is set may have a high emissivity so that the efficiency as the temperature-controlled vessel is increased.

The alignment apparatus (1 to 5) can be supported by the vessel 7 not by direct installation but through point support with three or more points. Point support means that the contact area between the alignment apparatus and vessel is sufficiently small with respect to the size of the alignment apparatus, so that when the vessel deforms by a pressure change or the like., the alignment apparatus (1 to 5) is not adversely affected by the deformation. Alternatively, point support means a state wherein heat flow between the vessel 7 and the alignment apparatus (1 to 5) through a support is negligibly small with reference to the size (heat capacity) of the alignment apparatus in terms of temperature change. If the alignment apparatus is supported in noncontact with the vessel by utilizing a levitating device using a magnetic force or pneumatic pressure, heat transfer from the vessel 7 to the alignment apparatus (1 to 5) through an object can be eliminated completely.

An exposure apparatus as one embodiment of the processing apparatus according to the present invention will be described with reference to FIG. 3. For example, the exposure apparatus can be formed as a projection exposure apparatus which performs step & scan exposure by using EUV light (with a wavelength of, e.g., 13.4 nm) as exposure illumination light. The exposure apparatus can have a light source section 100, illumination optical system 200, mask 300, and projection optical system 400. The exposure apparatus also has a mask stage 350 for placing the mask 300 thereon, and a wafer stage 550 for placing a target object 500 thereon. The mask stage 350 and wafer stage 550 are connected to a controller (not shown) and are driven by it. The light source section 100 and illumination optical system 200 make up an illumination device.

As the transmittance of the EUV light with respect to the atmosphere is low, in the exposure apparatus, the light source section 100 is stored in a vacuum vessel 12, while the remaining constituent elements 200 to 550 are stored in a vacuum vessel 14. Note that the entire apparatus need not be arranged in the vacuum atmosphere. It suffices at least an optical path where the EUV light passes is maintained in the vacuum atmosphere. The temperature-controlled vacuum vessel described above with reference to FIGS. 1 and 2 is applied to the vacuum vessels 12 and 14.

In the light source section 100, EUV light is generated at a plasma emission point 120. The light source section 100 has a nozzle 130 for spraying droplets serving as plasma generation targets, a droplet recovering portion 140 for recovering droplets which are not irradiated with excitation laser beam and for utilizing them again, a rotary ellipsoidal mirror 150, and a filter 170.

A high-output excitation pulse laser beam 110 emitted by an excitation laser section (not shown) comprised of an excitation laser light source and focusing optical system is focused at the position of the emission point 120. The droplets (e.g., Xe) serving as the targets for the laser plasma light source are sprayed by the nozzle 130 continuously with a predetermined time interval, and pass through the light focusing point 120. When a droplet sprayed in the above manner reaches the position 120, the excitation pulse laser beam 110 irradiates the droplet to generate the high-temperature plasma emission point 120. Heat radiation from the plasma generates EUV light radially.

The EUV light emitted from the plasma emission point 120 is focused by the rotary ellipsoidal mirror 150 and extracted as EUV beams 160. The rotary ellipsoidal mirror 150 has a multilayer reflection film for reflecting the EUV light efficiently, and is heated to a high temperature, during exposure, so that it absorbs part of the energy emitted from the high-temperature plasma 120. For this reason, the rotary ellipsoidal mirror 150 uses a material such as a metal having high thermal conductivity, and has a cooling means (not shown) so that it is cooled constantly. The filter 170 cuts particles (debris) scattering from the plasma and the periphery, and a wavelength which is not necessary for EUV exposure. The EUV beams 160 are introduced into an illumination optical system 200 of the vacuum vessel 14 through a window 210 formed in the boundary surface of the vacuum vessels 12 and 14. The window 210 has a function of allowing the EUV beams 160 to pass through it while maintaining the vacuum degree.

The illumination optical system 200 illuminates the mask 300 uniformly with EUV light having an arcuate spot corresponding to the arcuate field of view of the reflection type projection optical system 400. The illumination optical system 200 has rotary ellipsoidal mirrors 220 and 260, a parabolic mirror 240, reflection type integrators 230 and 250, a masking blade 270, and relay optical systems 282 to 286 (to be inclusively denoted by "280" hereinafter unless otherwise specified).

The rotary ellipsoidal mirror 220 reflects the EUV beams 160 introduced through the window 210 and forms parallel beams 222. The EUV light 222 as the parallel beams become incident on the reflection type convex cylindrical surface integrator 230 having a plurality of convex cylindrical surfaces 232. EUV light beams emitted from secondary light sources formed by the respective cylindrical surfaces 232 of the integrator 230 are focused and superposed by the parabolic mirror 240. Thus, the reflection type integrator 250 having a plurality of convex cylindrical surfaces 252 can be illuminated in the direction along which the cylinders are lined up, with substantially a uniform intensity distribution.

The reflection type integrator 230 has the plurality of cylindrical surfaces 232, and illuminates the reflection type integrator 250 uniformly (that is, substantially by Koehler illumination as will be described later) together with the parabolic mirror 240. Thus, the light intensity distribution in the radial direction of an arcuate illumination region (to be described later) can be made uniform, and the effective light source distribution of the reflection type integrator 250 can be made uniform. Each of the reflection type integrators 230 and 250 may be substituted by a fly-eye mirror formed by arranging two-dimensionally a large number of small convex or concave spherical surfaces having a repetition period.

The reflection type integrator 250 has the plurality of cylindrical surfaces 252, and illuminates the mask surface uniformly. When the substantially parallel EUV beams become incident on the reflection type integrator 250, the integrator 250 forms secondary light sources, and the angle distribution of the EUV light emitted from the secondary light sources forms a circular cone. Then, a reflection mirror having its focal points at the positions of the secondary light sources reflects the EUV light, and illuminates a mask 300 or a surface conjugate with the mask 300, thus enabling arcuate illumination.

The parabolic mirror 240 is arranged such that its focal position substantially coincides with the reflection surface of the integrator 230, and is set such that light beams reflected by the respective cylindrical surfaces on the reflection surface superpose on the reflection surface of the integrator 250. The parabolic mirror 240 suffices as far as it makes uniform the light intensity distribution in the longitudinal direction of the cylindrical reflection surfaces of the integrator 250. Although the parabolic mirror 240 must have a parabolic section, it is not necessarily a rotary parabolic mirror. In this manner, the parabolic mirror 240 is arranged to substantially serve as Koehler illumination with respect to the reflection surface of the integrator 250.

The EUV beams reflected by the integrator 250 are focused by the rotary ellipsoidal mirror 260 and form a uniform arcuate illuminated region on the masking blade 270 arranged at a position of a focal length f of the rotary ellipsoidal mirror 260.

The masking blade 270 has a light-shielding portion made of a material that absorbs the EUV light, and an opening with a desired arcuate shape which is optimal for exposure. The masking blade 270 has functions of shielding any unnecessary stray light which does not contribute to arcuate illumination, setting a desired slit width with a slit width changing mechanism (not shown), and correcting illumination nonuniformity well by partially changing the slit width.

The EUV beams that have passed through the arcuate opening of the masking blade 270 are converted with a desired magnification by the relay optical system, and form an arcuate illuminated region on the reflection type mask 300 held by the mask stage 350, to perform arcuate illumination. The relay optical system 280 formed of a plurality of mirror surfaces has a function of enlarging or reducing an arcuate shape with predetermined magnifications.

In a reflection type mask 300, a transfer pattern with a non-reflecting portion formed of an EUV absorbing body or the like is formed on a multilayer-film reflecting mirror. The EUV reflected light reflected by the reflection type mask 300 illuminated in an arcuate shape and having circuit pattern information is projected through the projection optical system 400 at a magnification optimal for exposure, to form an image on the target object 500 coated with a photosensitive material. Thus, the circuit pattern is exposed. The projection optical system 400 of this embodiment is a reflection type projection optical system constituted by six mirrors. The number of mirrors is not limited to six, but a desired number of mirrors, e.g., four, five, or eight mirrors, can be used.

Figure 3:
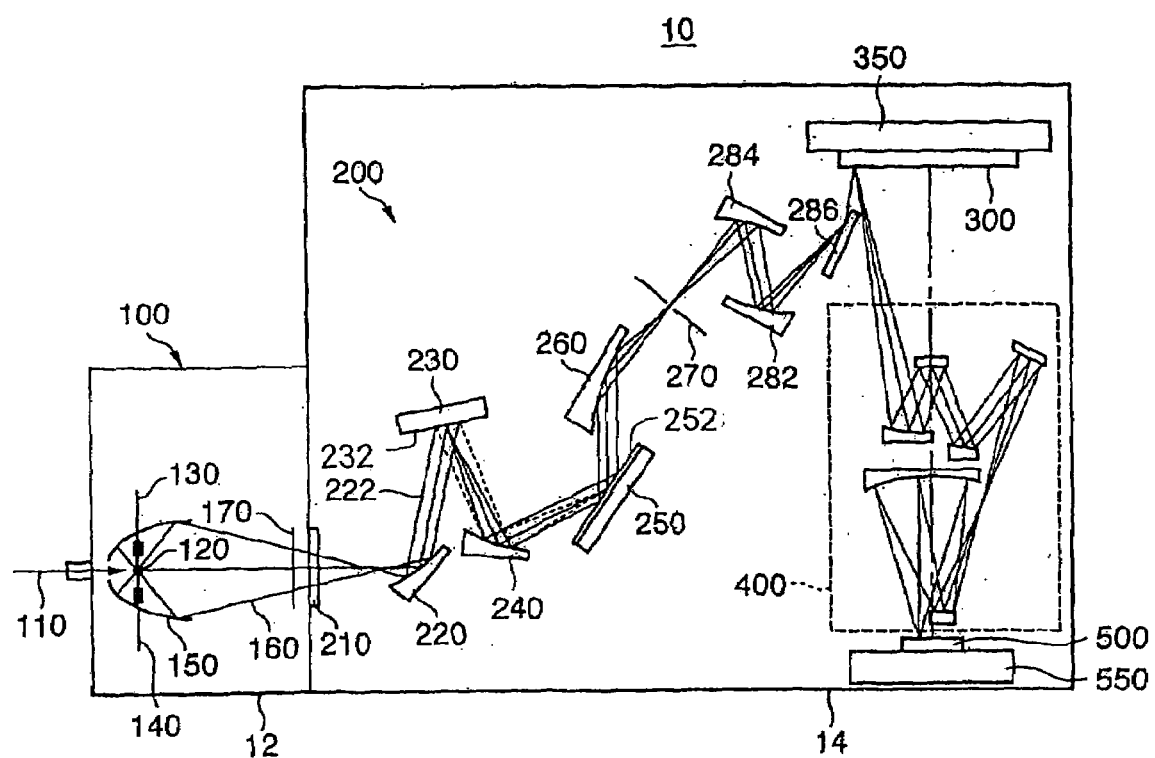
FIG. 3 is a schematic view showing an exposure apparatus according to an embodiment of the present invention that uses the vessel shown in FIG. 1 or 2.

The target object 500 is fixed to the wafer stage 550, and translates vertically and back and forth on the surface of the sheet of FIG. 3. The translation of the target object 500 is controlled by a length measurement unit such as a laser interferometer (not shown). The mask 300 is scanned in a direction parallel to the surface of the sheet of FIG. 3 at a speed v, and simultaneously the target object 500 is scanned in synchronism in the direction parallel to the surface of the sheet of FIG. 3 at a speed v/M, where M is the magnification of the projection optical system 400, so that whole image exposure is performed.

This embodiment exemplifies exposure of a wafer. However, the target object 500 as the exposure target is not limited to the wafer, but includes a liquid crystal substrate and other target objects in a wide range. The target object 500 is coated with a photoresist. The photoresist coating process includes a preprocess, an adhesion improving agent coating process, a photoresist coating process, and a prebaking process. The preprocess includes cleaning and drying. The adhesion improving agent coating process is a surface modifying (that is, imparting a hydrophobic nature by applying a surfactant) process aiming at improving adhesion of the photoresist and underlying layer. In the adhesion improving agent coating process, an organic film such as HMDS (Hexamethyl-disilazane) is formed by coating or vapor deposition. Prebaking is a baking (calcination) step but is softer than baking after development. In prebaking, the solvent is removed.

The wafer stage 550 supports the target object 500. The wafer stage 550 can employ any arrangement known in this field, and moves the target object 500 in the X, Y, and Z directions by utilizing, e.g., linear motors. The mask 300 and target object 500 are controlled by a controller (not shown), and are scanned in synchronism with each other. The mask stage 350 and wafer stage 550 are position-monitored by, e.g., laser interferometers, and are driven with a predetermined speed ratio.

Having mainly described an exposure apparatus that uses EUV light so far, this embodiment is not limited to the exposure apparatus that uses EUV light but can also be applied to an exposure apparatus that uses an electron beam. This embodiment can also be applied to an exposure apparatus that uses X-rays.

In addition to the alignment apparatus, exemplified as a preferred embodiment, which aligns an object, and an exposure apparatus which transfers or forms a pattern on an object, the processing apparatus of the present invention can also be widely applied to an apparatus (e.g., a CVD apparatus or etching apparatus) that processes an object with a plasma, an apparatus that inspects an object (e.g., an electron microscope), and the like.

Figure 6:
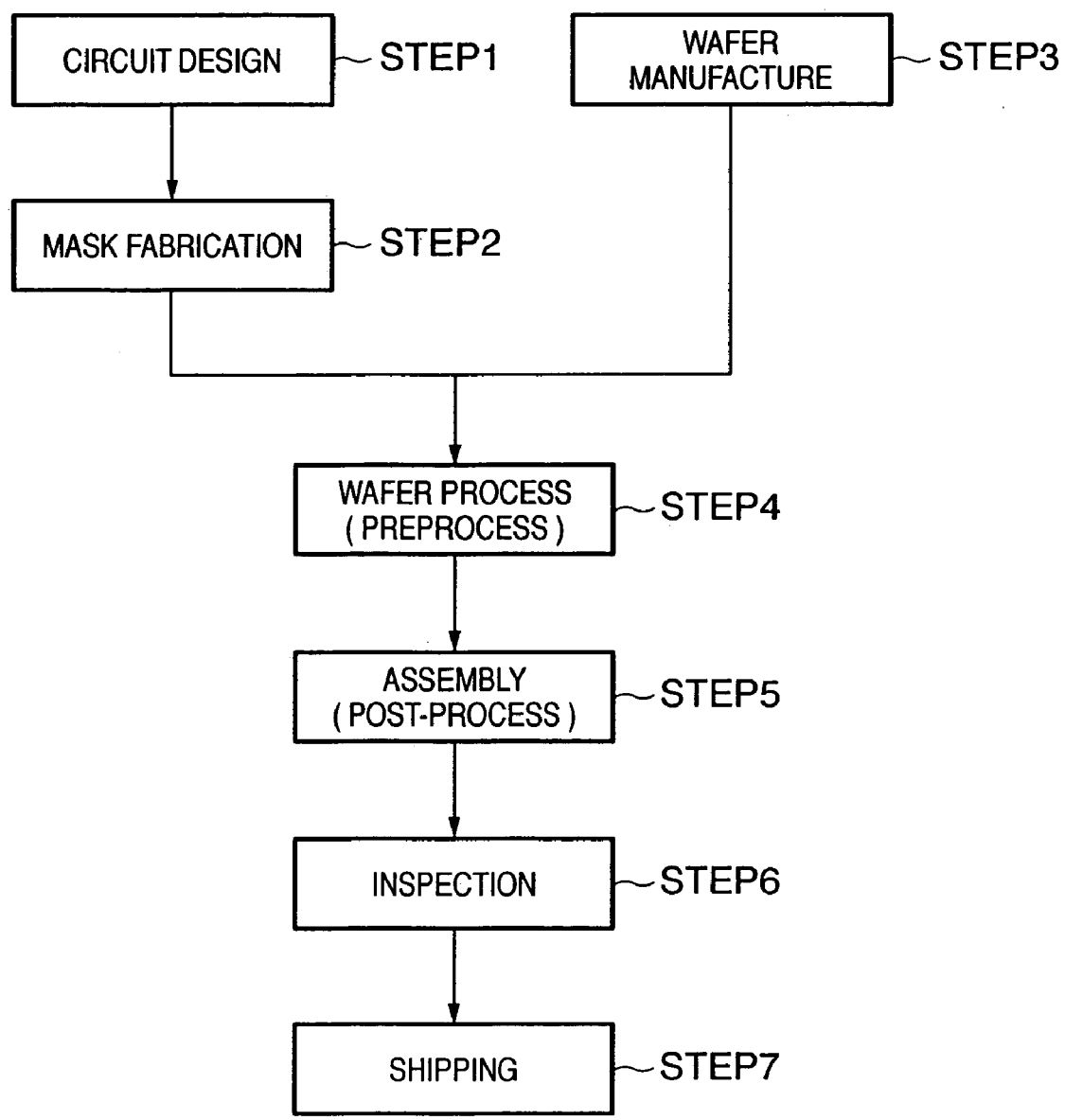
FIG. 6 is a flow chart for explaining the manufacture of a device (a semiconductor chip such as an IC or LSI, an LCD, a CCD, or the like)

A device manufacturing method utilizing the above exposure apparatus will be described with reference to FIGS. 6 and 7. FIG. 6 is a flow chart for explaining the manufacture of a device (a semiconductor chip such as an IC or LSI, an LCD, a CCD, or the like). The device manufacturing method will be explained with reference to the manufacture of a semiconductor chip. In step 1 (circuit design), the circuit of a device is designed. In step 2 (mask fabrication), a mask having the designed circuit pattern is fabricated. In step 3 (wafer manufacture), a wafer is manufactured using a material such as silicon. In step 4 (wafer process) called a preprocess, an actual circuit is formed on the wafer by lithography using the mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes, and is shipped (step 7).

Figure 7:
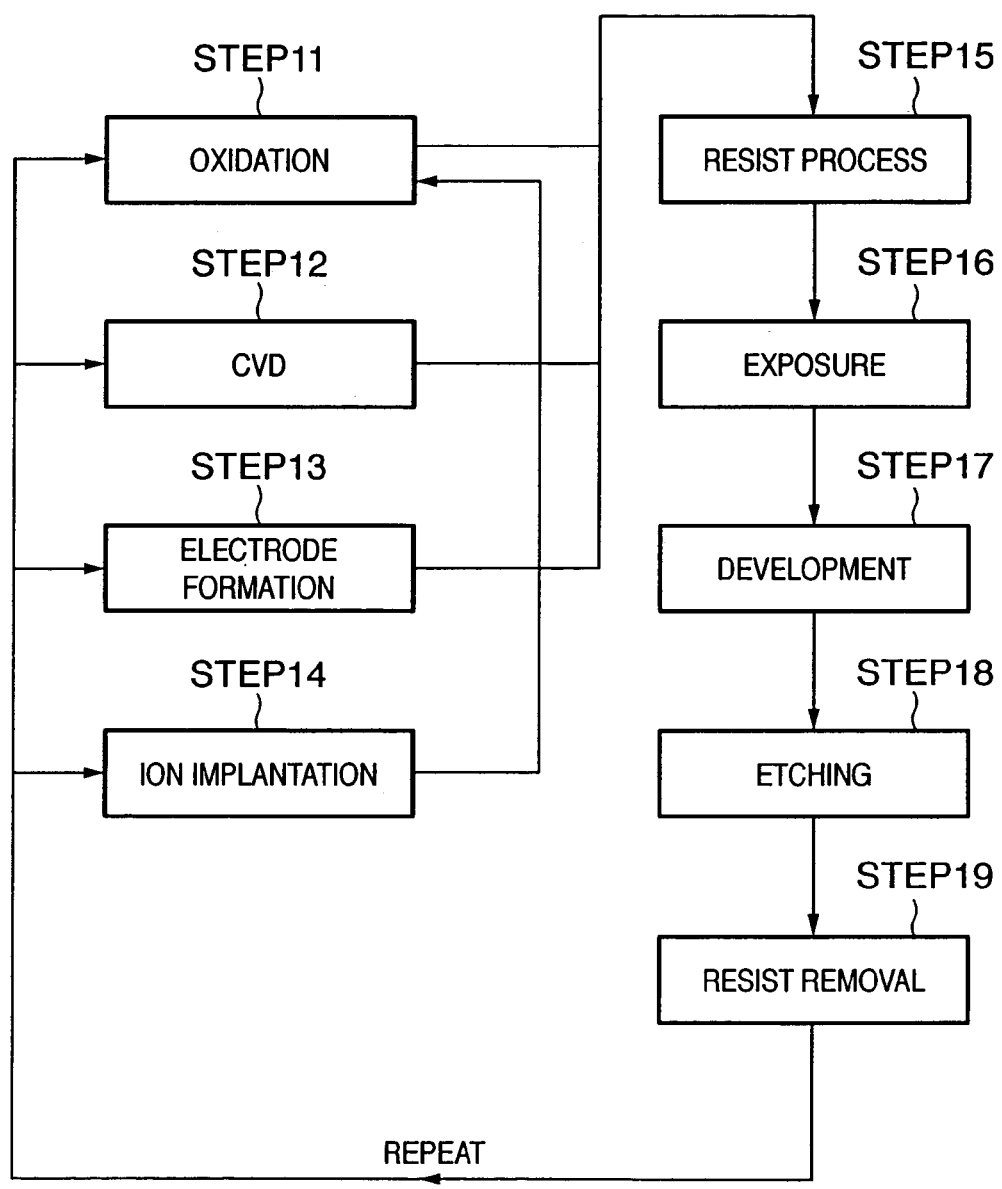
FIG. 7 is a detailed flow chart of the wafer process of step 4 shown in FIG. 6.
Figure 8:
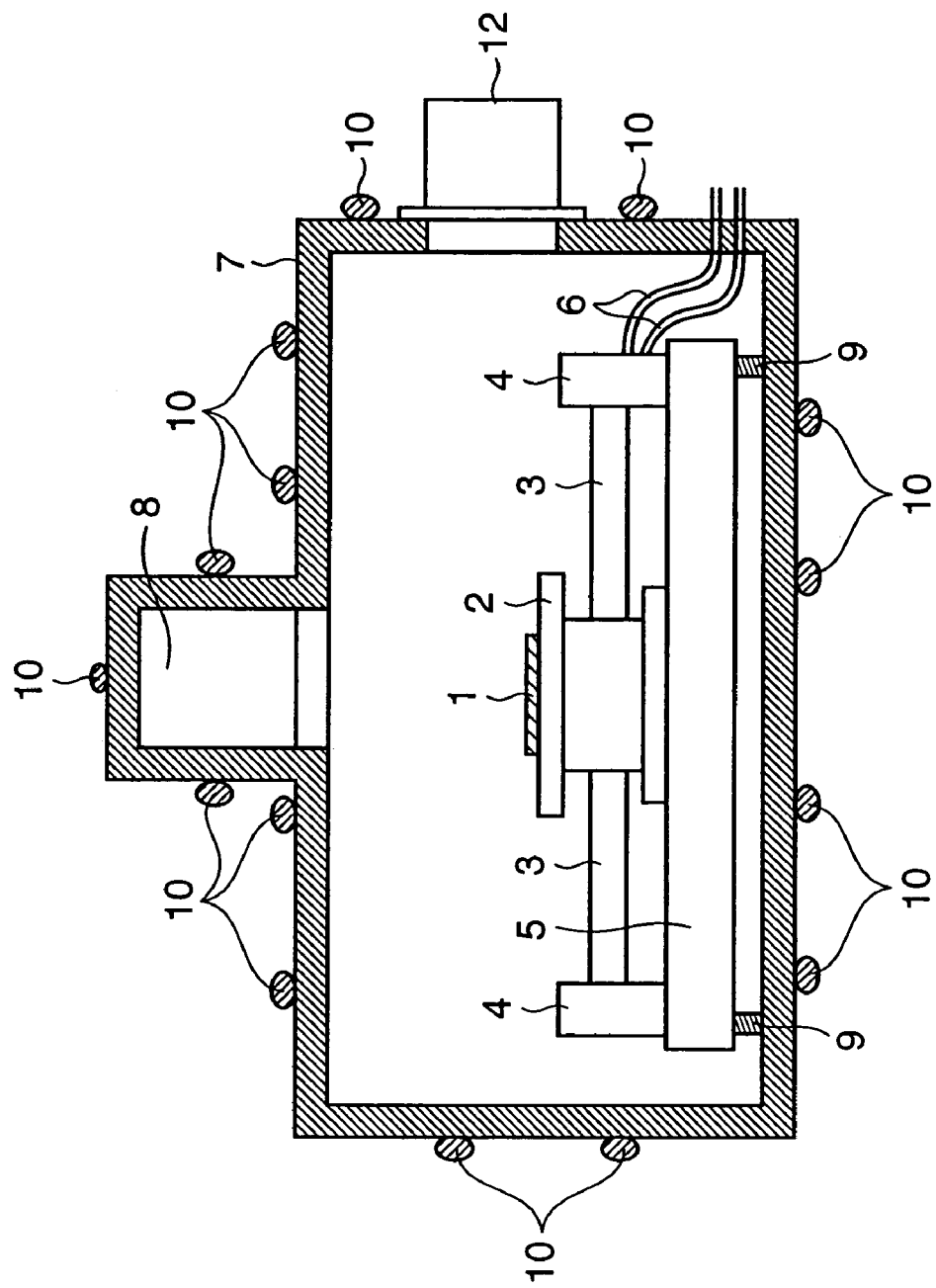
FIG. 8 is a schematic sectional view showing the arrangement of a vessel.
Figure 9:
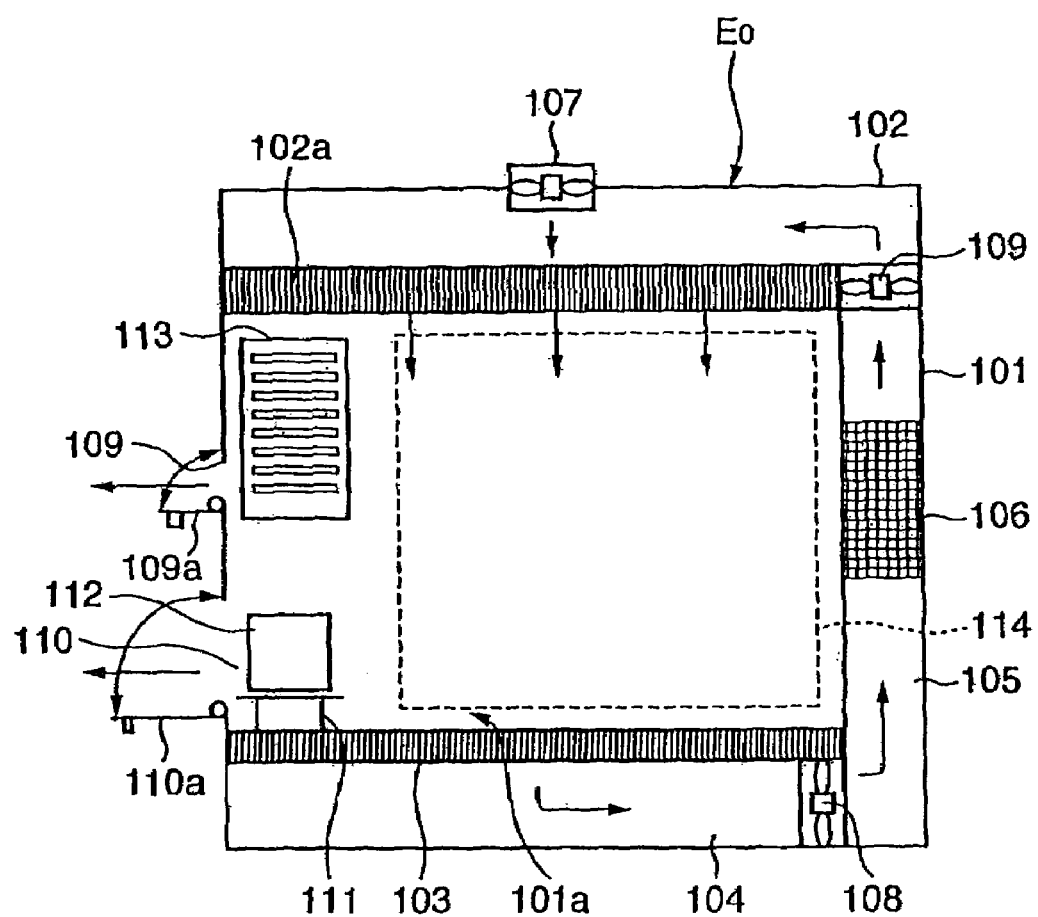
FIG. 9 is a schematic sectional view for explaining a conventional temperature-controlled vacuum vessel.

FIG. 7 is a detailed flow chart of the wafer process of step 4 shown in FIG. 6. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the circuit pattern of the mask is exposed on the wafer by an exposure apparatus 200. In step 17 (development), the exposed wafer is developed. In step 18 (etching), portions other than the developed resist image are etched. In step 19 (resist removal), any unnecessary resist remaining after etching is removed. By repeating these steps, a multilayered structure of circuit patterns is formed on the wafer.

Having described the preferred embodiments of the present invention, the present invention is not limited to these embodiments, but various changes and modifications can be made within the spirit and scope of the invention. For example, in place of providing the temperature adjusting plates 11, the refrigerant pipes 10 may be buried around the exhaust hole of the evacuation device 12, thus performing temperature adjustment.

The present application also discloses the following embodiments.

(First Embodiment) A temperature-controlled vacuum vessel for storing a target and maintaining the target at a constant temperature in a pressure-reduced or vacuum atmosphere, characterized by comprising:

a temperature adjusting member provided to at least part in the temperature-controlled vacuum vessel; and a temperature adjusting mechanism which adjusts the temperature of the temperature adjusting member.

(Second Embodiment) A temperature-controlled vacuum vessel according to the first embodiment, characterized in that the temperature adjusting mechanism adjusts the temperature of the temperature-adjusting member by utilizing a refrigerant.

(Third Embodiment) A temperature-controlled vacuum vessel according to the first embodiment, characterized by further comprising a heat-insulating member which supports the temperature adjusting member in the temperature-controlled vacuum vessel.

(Fourth Embodiment) A temperature-controlled vacuum vessel according to the first embodiment, characterized in that an emissivity of that surface of the temperature adjusting member which opposes the temperature-controlled vacuum vessel and/or an emissivity of an inner surface of the temperature-controlled vacuum vessel which opposes the temperature adjusting member is adjusted to be about 0.4 or less.

(Fifth Embodiment) A temperature-controlled vacuum vessel according to the first embodiment, characterized in that an emissivity of that surface of the temperature adjusting member which opposes the target and/or an emissivity of that surface of the target which opposes the temperature adjusting member is adjusted to be about 0.8 or more.

(Sixth Embodiment) A temperature-controlled vacuum vessel according to the first embodiment, characterized in that an emissivity of that surface of the temperature-controlled vacuum vessel which is maintained at a constant temperature is adjusted to be about 0.8 or more.

(Seventh Embodiment) A temperature-controlled vacuum vessel according to the first embodiment, characterized in that the temperature adjusting member is a plate-like member.

(Eighth Embodiment) An exposure apparatus characterized in that the apparatus operates with an optical system thereof being stored in a temperature-controlled vacuum vessel according to any one of the first to seventh embodiments.

(Ninth Embodiment) An exposure apparatus characterized by comprising a projection optical system which is stored in a temperature-controlled vacuum vessel according to any one of the first to seventh embodiments and projects onto a target object a pattern of a mask or reticle illuminated with a beam emerging from a light source having an extreme ultraviolet range or X-ray range.

(10th Embodiment) An exposure apparatus characterized in that a stage placing a mask thereon and/or a stage placing a target object thereon is stored in a temperature-controlled vacuum vessel according to any one of the first to ninth embodiments.

(11th Embodiment) An exposure apparatus characterized by comprising a stage which is stored in a temperature-controlled vacuum vessel according to any one of the first to seventh embodiments and places thereon a target object where a pattern of a mask or reticle is to be projected by using a beam emerging from a light source having an extreme ultraviolet range or X-ray range.

(12th Embodiment) An electron beam exposure apparatus characterized by comprising a stage which is stored in a temperature-controlled vacuum vessel according to any one of the first to seventh embodiments and places thereon a target object where a pattern is to be formed by using an electron beam.

(13th Embodiment) A device manufacturing method characterized by comprising steps of:

exposing a substrate by using an exposure apparatus according to any one of the eighth to twelfth embodiments; and subjecting the exposed substrate to a predetermined process.

When a temperature adjusting plate which is temperature-controlled by water cooling or the like is provided between devices in the vessel and the inner wall of the vessel, the devices in the vessel can be set at a uniform, constant temperature more easily than controlling the temperature of the vessel itself. When the emissivity of the vessel-side portion of the temperature adjusting plate is decreased, the temperature change of the vessel does not adversely affect temperature control of the temperature adjusting plate easily. When the emissivity of that surface of the temperature adjusting plate which is close to the devices in the vessel and the emissivities of the surfaces of the devices in the vessel are increased (e.g., about 0.8 to 0.9 or more), the temperature controlling effect of the vessel is increased. Regarding the surface of the inner wall of that region in the vessel which is maintained at a constant temperature, when its emissivity is set high, the efficiency as the temperature-controlled vessel is improved. When an exposure apparatus using such a temperature-controlled vacuum vessel is formed, a further improvement in the exposure accuracy can be expected.

As many apparently widely different embodiments of the present invention can be made without departing from the spirit and scope thereof, it is to be understood that the invention is not limited to the specific embodiments thereof except as defined in the claims.

What is claimed is:

1. A substrate processing apparatus, comprising:
   a substrate processing unit;
   a chamber which accommodates said substrate processing unit in a pressure-reduced ambient; and
   a temperature adjusting plate arranged between said substrate processing unit and said chamber,
   wherein said chamber has an exhaust port communicating with an exhaust portion, and
   said temperature adjusting plate has a hole and arranged near the exhaust port such that the hole corresponds to the exhaust port.

* * * * *